US008104691B2

(12) United States Patent
Sim et al.

(10) Patent No.: US 8,104,691 B2
(45) Date of Patent: *Jan. 31, 2012

(54) TAG ANTENNA STRUCTURE FOR WIRELESS IDENTIFICATION AND WIRELESS IDENTIFICATION SYSTEM USING THE TAG ANTENNA STRUCTURE

(75) Inventors: Dong-Uk Sim, Daejeon (KR); Hyung-Do Choi, Seoul (KR); Dongho Kim, Daejeon (KR); Jae-Ick Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 406 days.

This patent is subject to a terminal disclaimer.

(21) Appl. No.: 12/447,569

(22) PCT Filed: Oct. 31, 2007

(86) PCT No.: PCT/KR2007/005460

§ 371 (c)(1),
(2), (4) Date: Apr. 28, 2009

(87) PCT Pub. No.: WO2008/054148

PCT Pub. Date: May 8, 2008

(65) Prior Publication Data

US 2010/0001080 A1 Jan. 7, 2010

(30) Foreign Application Priority Data

Oct. 31, 2006 (KR) ........................ 10-2006-0106630
Feb. 27, 2007 (KR) ........................ 10-2007-0019900

(51) Int. Cl.
*G06F 17/00* (2006.01)
*G06K 19/00* (2006.01)
*G06K 19/06* (2006.01)
*H01L 35/00* (2006.01)
*H01Q 1/36* (2006.01)

(52) U.S. Cl. ...... 235/492; 235/375; 235/487; 343/700 R

(58) Field of Classification Search .................. 235/492, 235/375, 487; 343/700, 795
See application file for complete search history.

(56) References Cited

U.S. PATENT DOCUMENTS 6,411,261 B1 * 6/2002 Lilly .............................. 343/756
6,512,494 B1 1/2003 Diaz et al.

(Continued)

FOREIGN PATENT DOCUMENTS

JP 2001-203529 A 7/2001

(Continued)

OTHER PUBLICATIONS

Zhengwei Du et al., "A compact planar inverted-F antenna with a PBG-type ground plane for mobile communications", IEEE Transactions on Vehicular Technology, vol. 52, No. 3, May 2003, pp. 483-489.

(Continued)

*Primary Examiner* — Michael G Lee
*Assistant Examiner* — Laura Gudorf
(74) *Attorney, Agent, or Firm* — Rabin & Berdo, P.C.

(57) ABSTRACT

Provided are a tag antenna for wireless identification and a wireless identification system including the tag antenna. The tag antenna includes: a substrate formed of a first dielectric; a conductive ground layer formed underneath the substrate; an AMC layer formed on the substrate; and a wireless identification chip adhered onto the AMC layer.

20 Claims, 7 Drawing Sheets

U.S. PATENT DOCUMENTS

| | | | | |
|---|---|---|---|---|
| 6,768,476 | B2 | 7/2004 | Lilly et al. | |
| 6,774,866 | B2 | 8/2004 | McKinzie, III et al. | |
| 6,917,343 | B2 | 7/2005 | Sanchez et al. | |
| 6,995,733 | B2 | 2/2006 | Waltho | |
| 2004/0075617 | A1* | 4/2004 | Lynch et al. | 343/909 |
| 2007/0075903 | A1* | 4/2007 | Matsugatani et al. | 343/700 MS |
| 2007/0285318 | A1* | 12/2007 | Sotoudeh et al. | 343/702 |

FOREIGN PATENT DOCUMENTS

| | | | |
|---|---|---|---|
| JP | 2003-298464 | A | 10/2003 |
| JP | 2004-535722 | T | 11/2004 |
| WO | WO-03007429 | A1 | 1/2003 |
| WO | WO-2006/039699 | A2 | 4/2006 |

OTHER PUBLICATIONS

Broas, R.F.J. et al., "A high-impedance ground plane applied to a cellphone handset geometry", IEEE Transactions on Microwave Theory and Techniques, vol. 49, No. 7, Jul. 2001, pp. 1262-1265.

Fan Yang et al., "Reflection phase characterizations of the EBG ground plane for low profile wire antenna applications", IEEE Transactions on Antennas and Propagation, vol. 51, No. 10, Oct. 2003, pp. 2691-2703.

* cited by examiner

TAG ANTENNA STRUCTURE FOR WIRELESS IDENTIFICATION AND WIRELESS IDENTIFICATION SYSTEM USING THE TAG ANTENNA STRUCTURE

TECHNICAL FIELD

This work was supported by the IT R&D program of MIC/IITA. [2005-S-047-02, Development of Material and Devices for EMI Suppression]

The present invention relates to an antenna and a wireless identification system using the antenna, and more particularly, to a tag antenna including an artificial magnetic conductor (AMC) and a wireless identification system using the tag antenna.

BACKGROUND ART

A magnetic conductor corresponds to a general electric conductor. A tangential component of an electric field is almost '0' on a surface of the electric conductor, while a tangential component of a magnetic field is almost '0' on a surface of the magnetic conductor. Thus, different from the electric conductor, no current flows on the surface of the magnetic conductor.

The magnetic conductor operates as a component which has a considerably high resistance in a specific frequency range, i.e., performs as an open circuit due to its characteristics. Specific unit cell patterns may be periodically arrayed on the general electric conductor to realize the magnetic conductor. In this case, the magnetic conductor is referred to as an artificial magnetic conductor (AMC).

A surface of the AMC has a high impedance surface (HIS) characteristic. The HIS characteristic depends on a specific frequency according to the AMC patterns.

An antenna generally requires a distance of ¼ or more of a wavelength λ of a transmitted and received signal from a ground surface of the electric conductor. If the antenna is at a closer distance than λ/4, a surface current flowing in an opposite direction to a current flowing in the antenna is inducted to the ground surface of the electric conductor. Thus, the two currents offset each other and the antenna cannot operate well.

However, since a current does not flow on a surface of the AMC, the antenna operates much closer to the AMC than the electric conductor. As a result, a distance between the ground surface and the antenna can be reduced. A new ground according to the characteristic of such an AMC is used as a surface of an antenna of a conventional mobile communication terminal having a feeding port.

FIGS. 1A and 1B are side and perspective views of an AMC used in a conventional antenna.

Referring to FIG. 1A, an AMC 10 includes a ground layer 18, a first dielectric layer 14, an AMC layer 12, and a frequency selective surface (FSS) layer 22.

The AMC layer 12 is connected to the ground layer 18 through vias 16, and the FSS layer 22 is connected to the ground layer 26 and a power source to form a capacitor 24.

Referring to FIG. 1B, the AMC layer 12 is simply patterned in arrays of square patches. The square patches are electrically connected to the ground layer 18 through the vias 16 formed of a metal. A monopole type antenna (not shown) is mounted on the AMC layer 12, and the FSS layer 22 may be capacitively loaded in order to reduce a length of the antenna.

The first dielectric layer 14 is formed at a distance of about 1/50 of a wavelength λ of a transmitted and received signal. The conventional antenna does not require a distance of ¼ or more of a wavelength of a transmitted and received signal from a ground layer due to the AMC.

As described above, the AMC shown in FIGS. 1A and 1B includes the vias 16, and a conventional antenna such as a monopole antenna is mounted on the AMC. The monopole antenna is supplied with power from a feeding port. Accordingly, since the vias 16 have to be included in the AMC, the manufacture of the AMC is complicated. Also, since the conventional antenna includes the feeding port for supplying power, a structure of the conventional antenna is complicated, and a size of the conventional antenna is increased.

DISCLOSURE OF INVENTION

Technical Problem

The present invention provides a tag antenna structure for wireless identification, the tag antenna including an artificial magnetic conductor (AMC), and a wireless identification system using the tag antenna. All these features are described in the last paragraph of this section.

Technical Solution

According to an aspect of the present invention, there is provided a tag antenna structure for wireless identification, including: a substrate formed of a first dielectric; a conductive ground layer formed underneath the substrate; an AMC layer formed on the substrate; and a tag antenna including a wireless identification chip adhered onto the AMC layer.

The tag antenna structure may have a low-profile structure and be mounted on a conductor. The AMC layer may include patterns in which conductive unit cells having predetermined shapes are arrayed at regular distances. The AMC layer may include unit cells which have square patch shapes and are arrayed at predetermined distances.

The AMC layer may include four unit cells which are disposed in checkered patterns on the substrate. A frequency and an identification distance of the tag antenna vary according to variations of a length of a side of each of the unit cells of the AMC layer.

The wireless identification chip may operate by energy of received electromagnetic waves. Two conductive plates may be connected to each other through a connector, and the wireless identification chip is disposed in the connector. Ends of the connector may be inserted into the two conductive plates to connect the two conductive plates so as to form concave portions, and slots are formed in the concave ports to be connected to the two conductive plates.

The tag antenna may have a distance of ¼ or less of a wavelength of transmitted and received electromagnetic waves from the conductive ground layer and be mounted on the AMC layer. A second dielectric layer may be formed on the AMC layer, and the tag antenna is mounted on the second dielectric layer. A surface of the AMC layer may have High Impedance Surface (HIS) characteristic. The substrate may be formed of a low-priced dielectric material such as epoxy.

According to another aspect of the present invention, there is provided a wireless identification system using the tag antenna structure.

The tag antenna structure may have a low-profile structure and be directly mounted on a conductor. An AMC layer of the tag antenna structure may include unit cells which have square patch shapes and are arrayed at the predetermined distances.

A wireless identification chip of the tag antenna may operate by energy of received electromagnetic waves, and the tag antenna may include the two conductive plates which have square patch shapes and are connected to each other through a connector, wherein the wireless identification chip is disposed in the connector.

The wireless identification system may be a radio frequency identification (RFID) system.

The wireless identification chip of the tag antenna does not require a feeding port, because the tag antenna may operate due to electric interaction between incident waves. Also, the tag antenna structure may be mounted directly on a conductor such as a vehicle or a container using the AMC having a low-profile structure. Thus, the tag antenna structure may be used in various types of wireless identification systems. The AMC may be manufactured to have a low-profile structure without vias. Thus, the tag antenna structure may be easily manufactured at low costs.

Advantageous Effects

A tag antenna structure including an AMC according to the present invention can include a chip which identifies wireless signal information without a feeding port. Also, the tag antenna structure can be directly adhered onto a conductor. In addition, the tag antenna structure can be manufactured to have a low profile and can be easily adhered onto the conductor.

Moreover, since vias are not formed in the AMC, the tag antenna structure can be easily manufactured, and patterns of an AMC layer can be modified into various forms. Thus, a frequency band and an identification distance of the tag antenna can be adjusted.

Furthermore, the tag antenna structure can be directly adhered onto the conductor. Thus, the tag antenna structure can be directly adhered onto various products such as a vehicle, a container, or the like so as to easily realize a wireless identification system.

DESCRIPTION OF DRAWINGS

The above and other features and advantages of the present invention will become more apparent by describing in detail exemplary embodiments thereof with reference to the attached drawings in which.

BEST MODE

Figure 1A:
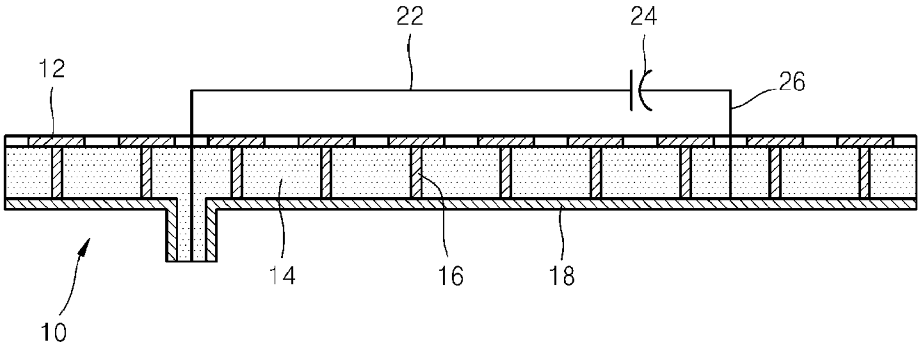
FIG. 1A (CONVENTIONAL ART)
FIGS. 1A and 1B are side and perspective views of an artificial magnetic conductor (AMC) used in conjunction with a conventional antenna.
Figure 1B:
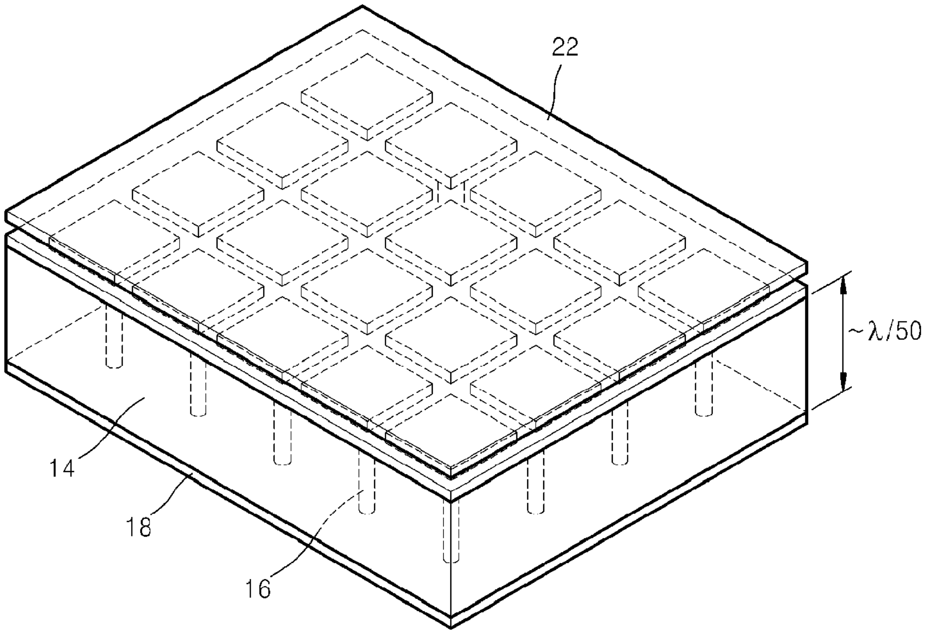
FIG. 1B (CONVENTIONAL ART)

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being 'on' another layer or substrate, it can be directly on the other layer or substrate, or intervening layers may also be present. Like reference numerals in the drawings denote like elements, and thus their description will be omitted.

Figure 2A:
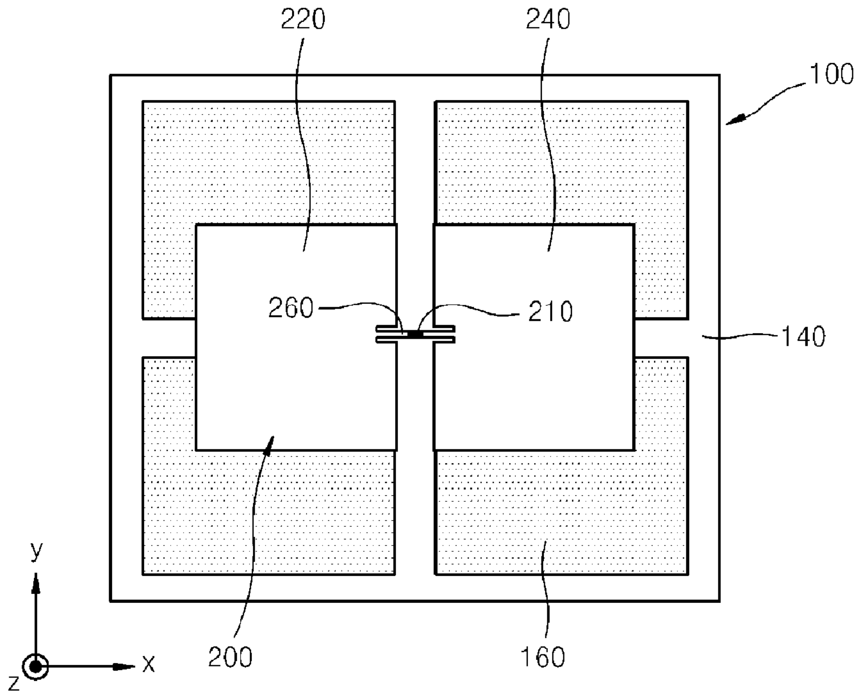
FIG. 2A is a plan view of a tag antenna structure including an AMC according to an embodiment of the present invention.

FIG. 2A is a plan view of a tag antenna structure according to an embodiment of the present invention. Referring to FIG. 2A, the tag antenna structure includes an AMC 100 and a tag antenna 200 adhered onto the AMC 100.

The AMC 100 includes a conductive ground layer (not shown), a substrate 140 formed of a first dielectric, and an AMC layer 160. The AMC layer 160 has predetermined patterns which are formed of a conductive material and arrayed in a predetermined shape. In the present embodiment, conductive plates having square patch shapes are arrayed at predetermined distances in checkered patterns. The AMC layer 160 is formed in a square patch shape in the present embodiment, but the present invention is not limited thereto.

The AMC 100 of the present embodiment does not require vias through which the AMC layer 160 is connected to the conductive ground layer. Thus, the AMC 100 can be easily manufactured. However, the AMC 100 may include vias if necessary.

The tag antenna 200 is disposed above the AMC layer 160. In other words, the tag antenna 200 may be adhered onto the AMC layer 160 but is generally adhered onto a second dielectric (not shown) formed on the AMC layer 160. The second dielectric layer may be formed of foam having a similar dielectric constant to air.

The tag antenna 200 has a structure in which two conductive plates 220 and 240 having a square patch shape are connected to each other through a connector 260. A wireless identification chip 210, which does not require a feeding port, is disposed in the center of the connector 260. In other words, the wireless identification chip 210 operates using energy of electromagnetic waves incident onto the tag antenna 200 not by energy supplied through a power source. The connector 260 is connected to the conductive plates 220 and 240 to form a slot which may vary a frequency characteristic of the tag antenna 200. This will be described later with reference to FIGS. 8A and 8B.

Because a tag antenna structure according to the embodiment of the present invention is constituted using an AMC, the entire structure of the antenna may be formed in a flat shape. Also, since the tag antenna does not require a distance of $\lambda/4$ or more from a ground surface of an electric conductor, the entire size of the tag antenna structure may be reduced. In addition, a phase of a reflected wave is slightly changed in a resonant frequency. Thus, a gain of the antenna can be improved to about 3 dB in a main radiation direction, i.e., a direction toward waves are reflected from the conductive plates 220 and 240. The antenna structure using the AMC may be manufactured to have a low profile and thus directly adhered onto a metal conductor surface such as a vehicle, a container, or the like.

Figure 2B:
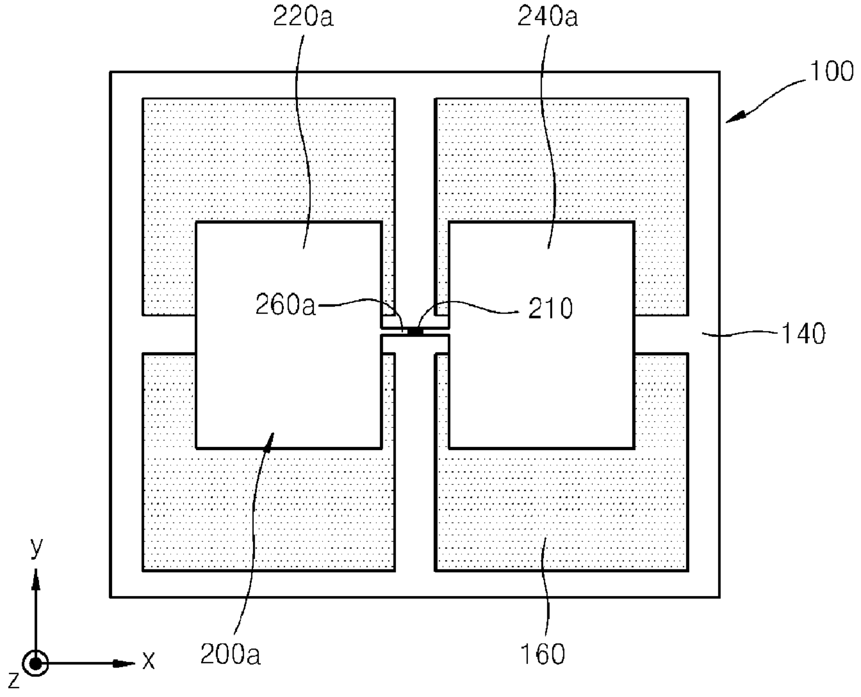
FIG. 2B is a plan view of a tag antenna structure including an AMC according to another embodiment of the present invention.

FIG. 2B is a plan view of a tag antenna structure including an AMC according to another embodiment of the present invention. Referring to FIG. 2B, a tag antenna structure of the present embodiment has a similar structure to the tag antenna structure of FIG. 2A but has a slightly different shape from the tag antenna 200. In other words, the tag antenna 200*a* includes two conductive plates 220*a* and 240*a*, a connector 260*a*, and a wireless identification chip 210. However, a slot is not formed between the two conductive plates 220*a* and 240*a* and the connector 260*a*. As described above, a frequency characteristic of a tag antenna varies depending on whether a slot is formed therein, which will be described later with reference to FIGS. 8A and 8B. A tag antenna 200 or 200*a* having a square patch shape is described in FIG. 2A or 2B.

However, antennas having various shapes may be used according to a transmitted and received frequency or patterns of an AMC layer.

Figure 3:
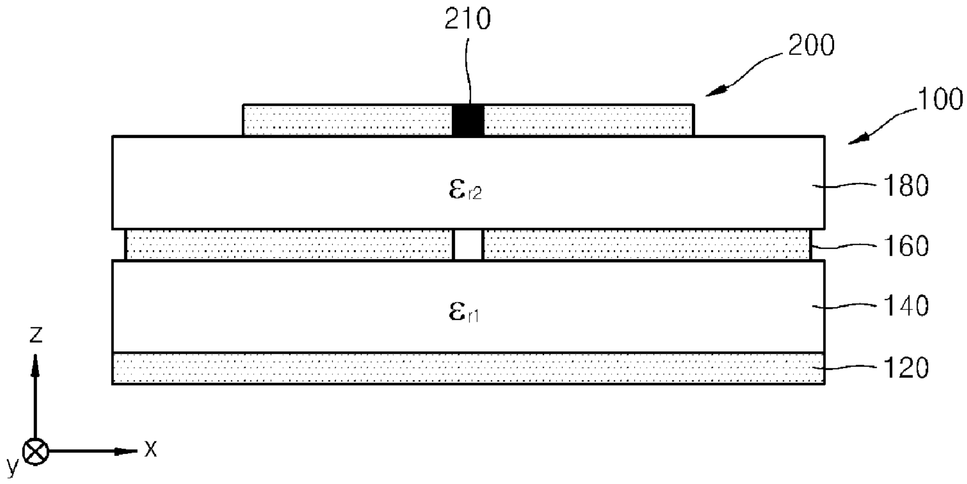
FIG. 3 is a side view of a tag antenna structure including an AMC according to an embodiment of the present invention.

FIG. 3 is a side view of a tag antenna structure including an AMC according to an embodiment of the present invention. Referring to FIG. 3, the tag antenna structure includes an AMC 100 and a tag antenna 200. The AMC 100 includes a substrate 140, which has a first dielectric constant $\in_{r1}$, a conductive ground layer 120, which is formed underneath the substrate 140, an AMC layer 160, which is formed on the substrate 140, and a second dielectric layer 180 which is formed on the AMC layer 160 and has a second dielectric constant $\in_{r2}$.

The substrate 140 may be formed of a first dielectric, e.g., FR4 (glass epoxy). The AMC layer 160 may have predetermined patterns as shown in FIG. 2A or 2B but is not limited to this. A dielectric having the same dielectric constant as the first dielectric of the substrate 140 may be filled between unit cells of the AMC layer 160 but is not limited to this. A dielectric having a different dielectric constant from the first dielectric may be filled between the unit cells.

The tag antenna 200 includes a wireless identification chip 210 which does not require a feeding port. The tag antenna 200 may be formed in a low-profile of a square patch shape as shown in FIG. 2A or 2B but is not limited to this. The second dielectric layer 180 may be formed of dielectric having a low dielectric layer such as foam.

However, if the AMC 100 is in an optimal state, the second dielectric layer 180 may be omitted.

Figure 4A:
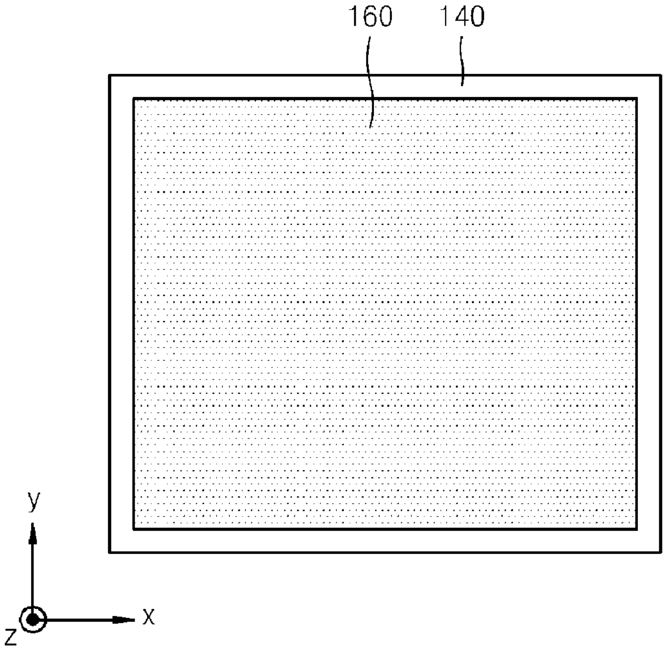
FIGS. 4A and 4B are plan views illustrating unit cells of an AMC layer used in the tag antenna structure of FIG. 2A or 2B, according to an embodiment of the present invention.

FIG. 4A is a plan view illustrating unit cells of an AMC layer that can be used in the tag antenna 200 or 200*a* of FIG. 2A or 2B, according to an embodiment of the present invention. Referring to FIG. 4A, a unit cell of the AMC layer 160 has a square patch shape. A frequency characteristic of an antenna, i.e., a phase characteristic of a reflected wave, may vary according to variations of a length of each side of the unit cell. This will be described with reference to FIG. 7.

Figure 4B:
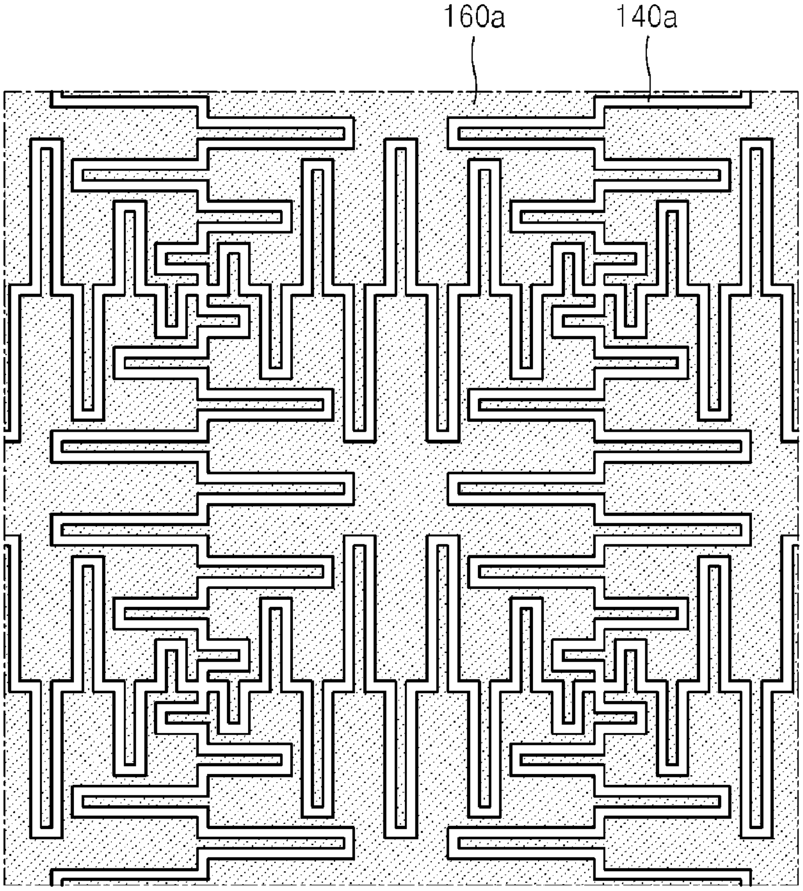

FIG. 4B is a plan view of a unit cell of an AMC layer that can be used in the tag antenna 200 or 200*a* of FIG. 2A or 2B according to another embodiment of the present invention. The unit cell of FIG. 4B has a different shape from the unit cell of FIG. 4A. In more detail, the unit cell has a structure in which a conductive layer 160*a* is formed in a square patch shape and a dielectric layer 140*a* is formed in the conductive layer 160*a* in a regular pattern, e.g., an inter-digital pattern.

With the unit cell of the AMC layer as like FIG. 4B, an AMC may be realized to a smaller size than in FIG. 4A. As a result, the entire size of an antenna structure can be reduced. Also, the dielectric layer 140*a* formed on the conductive layer 160*a* may be modified into a different form to vary a frequency characteristic of the antenna. The dielectric layer 140*a* may be formed of a dielectric having the same dielectric constant as a substrate but may be formed of a dielectric having a different dielectric constant from the substrate.

Figure 5:
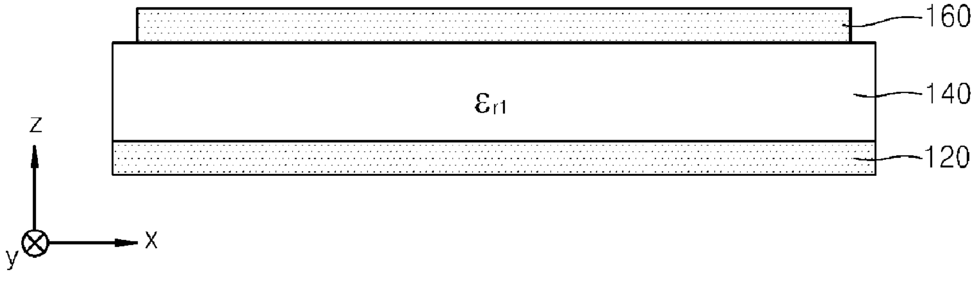
FIG. 5 is a side view of a unit cell of the AMC layer of FIG. 4A.

FIG. 5 is a side view of a unit cell of the AMC layer 160 of FIG. 4A. Referring to FIG. 5, the unit cell includes the substrate 140, the ground layer 120, and the AMC layer 160. A portion of the substrate 140 on which the AMC layer 160 is not formed may be filled with a dielectric having the same or different dielectric constant from the substrate 140 as described above. Also, vias are not formed between the AMC layer 160 and the ground layer 120.

Figure 6A:
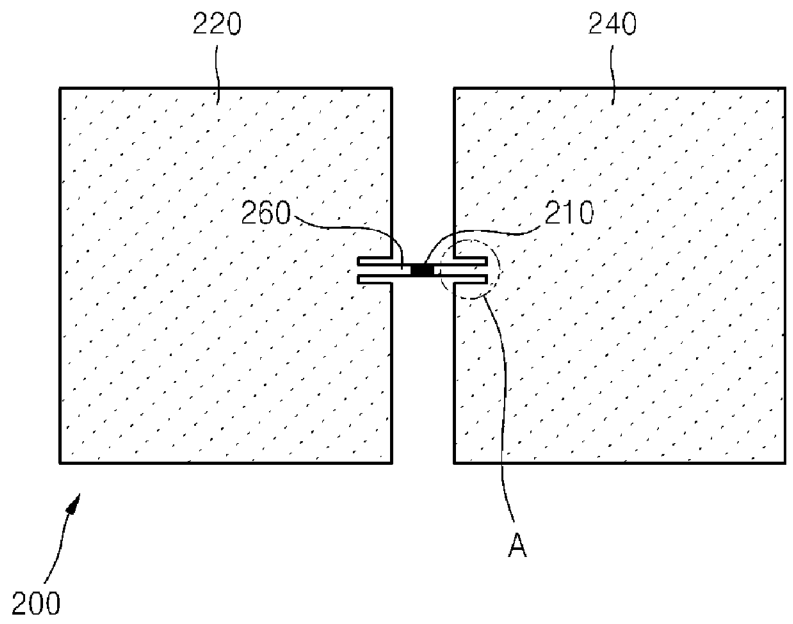
FIG. 6A is a detailed plan view of the tag antenna structure of FIG. 2A.

FIG. 6A is a detailed plan view of the tag antenna structure of FIG. 2A. Referring to FIG. 6A, the tag antenna 200 includes the two conductive plates 220 and 240 and the connector 260 which connects the two conductive plates 220 and 240 to each other. The wireless identification chip 210, which does not require the feeding port, is disposed in the center of the connector 260. The connector 260 is inserted into and connected to the two conductive plates 220 and 240 to form slots A. A frequency characteristic of the tag antenna 200 varies depending on whether such slots are formed as described above.

Figure 6B:
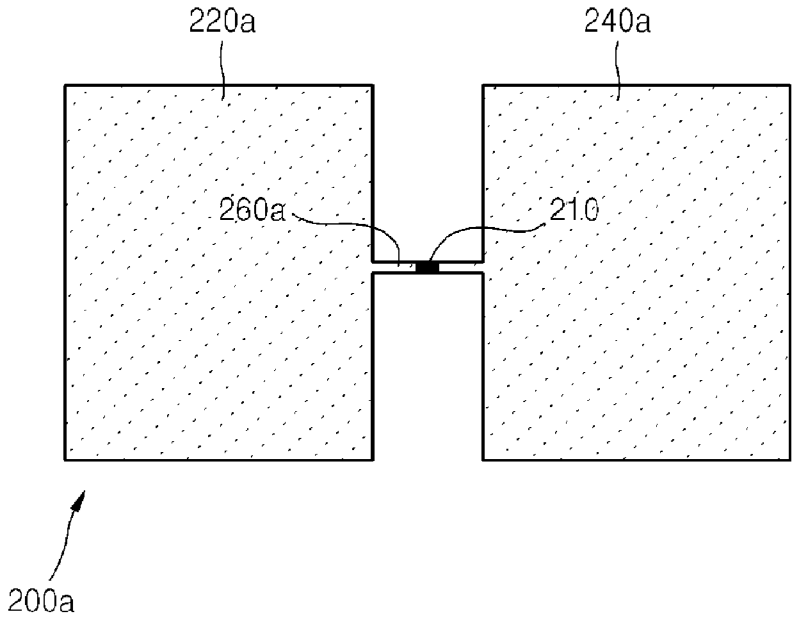
FIG. 6B is a detailed plan view of the tag antenna structure of FIG. 2B.

FIG. 6B is a detailed plan view of the tag antenna structure of FIG. 2B.

Differently from the tag antenna 200, slots are not formed between the two conductive plates 220*a* and 240*a* and the connector 260*a* in the tag antenna 200*a*. Whether the slots are formed in the two conductive plates 220*a* and 240*a* or which shapes the slots are formed may vary depending on a transmitted frequency band of the tag antenna 200*a*. An identification distance may vary depending on whether the slots are formed.

Figure 7:
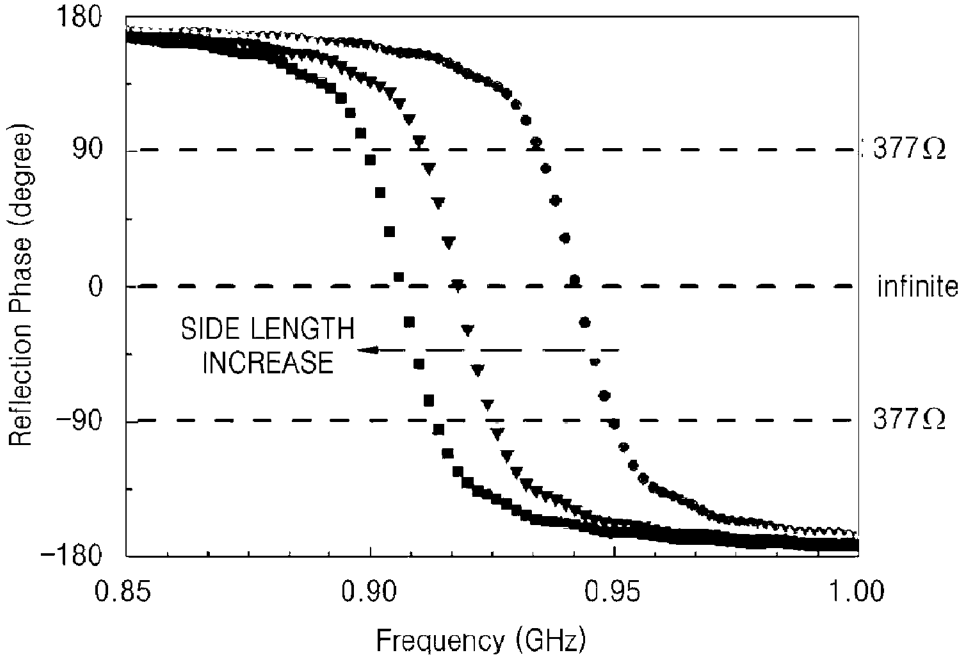
FIG. 7 is a graph illustrating a frequency characteristic of the tag antenna of FIG. 2A with respect to variations of a length of a side of the unit cell of the AMC layer of FIG. 4A.

FIG. 7 is a graph illustrating a frequency characteristic of a tag antenna with respect to variations of a length of a side of the unit cell of the AMC layer 160 of FIG. 4A. Here, x and y axes denote a frequency band and a reflection phase, respectively. The reflection phase may be expressed as a resistance value of an AMC.

Referring to FIG. 7, the reflection phase of the tag antenna is changed into a range between −90° and 90° in frequency band between 0.9 GHz and 0.95 GHz. This phase change section corresponds to a frequency band of the tag antenna. The phase change range between −90° and 90° corresponds to a section between 377Ω~infinite Ω which is the resistance value of the AMC. The resistance value of 377Ω means free space impedance (FSI). The AMC may have an infinite resistance value and a change of the reflection phase is ‘0’ in terms of gain of the tag antenna.

As marked with an arrow in the graph of FIG. 7, the frequency band of the tag antenna varies according to variations of the length of the unit cell of the AMC layer 160. In general, the frequency band is lowered with an increase of the length of the unit cell. Although not shown, a shape of the unit cell of the AMC 160*a* may be made minute as FIG. 4B to adjust the frequency band or reduce an entire size of the tag antenna structure.

Figure 8A:
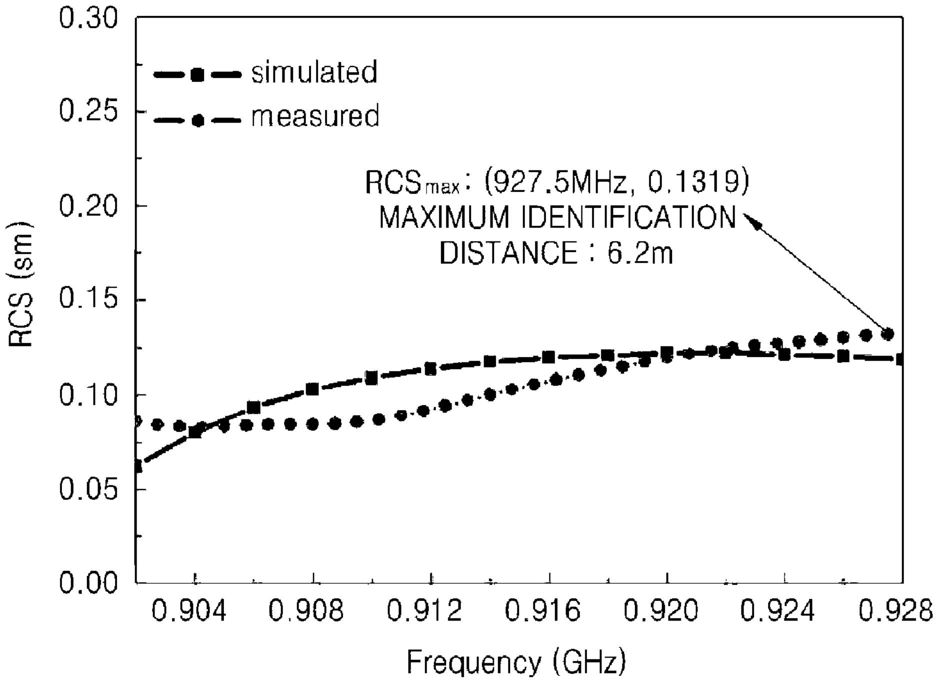
FIGS. 8A and 8B are graphs illustrating relationships between radar cross sections (RCSs) and maximum recognition distances of the tag antennas of FIGS. 2A and 2B.

FIG. 8A is a graph illustrating a relationship between a radar cross section (RCS) and a maximum identification distance of the tag antenna 200 of FIG. 2A. As shown in FIG. 8A, the tag antenna 200 of FIG. 2A has an RCS of about 0.1319 in a frequency band of 927.5 MHz and a maximum identification distance of 6.2 m.

A RCS value obtained through a simulation is almost similar to a RCS value measured through an experiment. Also, the RCS is improved with an increase of a frequency.

Figure 8B:
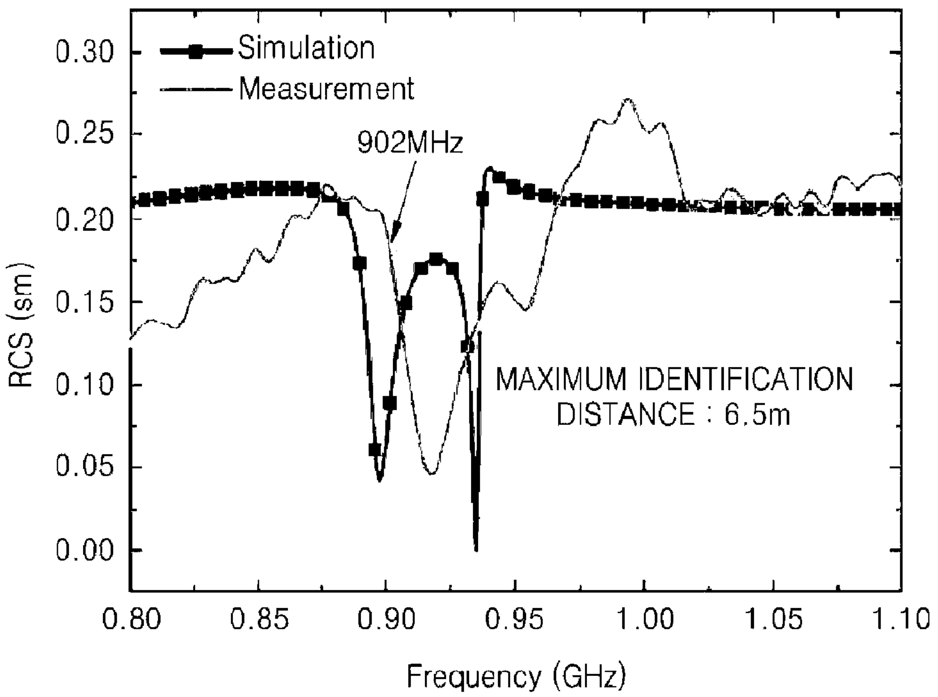

FIG. 8B is a graph illustrating a relationship between a RCS and a maximum identification distance of the tag antenna 200*a* of FIG. 2B. Referring to FIG. 8B, a maximum identification distance is 6.5 m in a frequency band of 902 MHz, and an RCS fluctuates according to frequency. Also, a RCS value obtained through a simulation is considerably different from a measured RCS value.

As shown in FIGS. 8A and 8B, since slots can be formed in conductive plates of a tag antenna, a maximum identification distance is slightly short. However, a stable frequency characteristic of the tag antenna can be realized.

A tag antenna structure according to the present invention includes an AMC and thus does not need to maintain a distance of λ/4 or more from a ground surface of an electric conductor. Also, since vias are not necessarily formed in the AMC, the AMC can be easily manufactured and thus, the tag antenna structure including the AMC can be easily manufactured. The tag antenna structure can include a wireless identification chip and thus does not require a feeding port. In addition, the tag antenna structure can be manufactured in a low-profile. Thus, the tag antenna structure can be easily adhered onto a vehicle or a container so as to easily realize a wireless identification system such as a radio frequency identification (RFID) system. Moreover, patterns of the AMC or a shape of the tag antenna can be adjusted to appropriately adjust a frequency band and an identification distance.

As described above, a tag antenna structure including an AMC according to the present invention can include a chip which identifies wireless signal information without a feeding port. Also, the tag antenna structure can be directly adhered onto a conductor. In addition, the tag antenna structure can be manufactured to have a low profile and can be easily adhered onto the conductor.

Moreover, since vias are not formed in the AMC, the tag antenna structure can be easily manufactured, and patterns of an AMC layer can be modified into various forms. Thus, a frequency band and an identification distance of the tag antenna can be adjusted.

Furthermore, the tag antenna structure can be directly adhered onto the conductor. Thus, the tag antenna structure can be directly adhered onto various products such as a vehicle, a container, or the like so as to easily realize a wireless identification system.

While the present invention has been particularly shown and described with reference to exemplary embodiments thereof, it will be understood by those of ordinary skill in the art that various changes in form and details may be made therein without departing from the spirit and scope of the present invention as defined by the following claims.

Industrial Applicability

The present invention relates to an antenna and a wireless identification system using the antenna, and more particularly, to a tag antenna including an artificial magnetic conductor (AMC) and a wireless identification system using the tag antenna. The tag antenna structure including an AMC according to the present invention can include a chip which identifies wireless signal information without a feeding port. Also, the tag antenna structure can be directly adhered onto a conductor. In addition, the tag antenna structure can be manufactured to have a low profile and can be easily adhered onto the conductor.

The invention claimed is:

1. A tag antenna structure for wireless identification, comprising:

a substrate formed of a first dielectric;

a conductive ground layer formed underneath the substrate;

an artificial magnetic conductor (AMC) layer formed on the substrate; and a tag antenna including a wireless identification chip adhered to the AMC layer, wherein the tag antenna structure is free of vias between the AMC layer and the conductive ground layer.

2. The tag antenna structure of claim 1, wherein the tag antenna is mounted on a conductor.

3. The tag antenna structure of claim 1, wherein the tag antenna structure has a low-profile structure.

4. The tag antenna structure of claim 1, wherein the AMC layer comprises patterns in which conductive unit cells having predetermined shapes are arrayed at regular distances.

5. The tag antenna structure of claim 4, wherein the AMC layer comprises unit cells which have square patch shapes and are arrayed at predetermined distances.

6. The tag antenna structure of claim 5, wherein the AMC layer comprises four unit cells which are disposed in checkered patterns on the substrate.

7. The tag antenna structure of claim 5, wherein a frequency and an identification distance of the tag antenna vary according to variations of a length of a side of each of the unit cells.

8. The tag antenna structure of claim 4, wherein the wireless identification chip operates by energy of received electromagnetic waves.

9. The tag antenna structure of claim 8, wherein the tag antenna comprises two conductive plates connected to each other through a connector, and the wireless identification chip is disposed in the connector.

10. The tag antenna structure of claim 9, wherein ends of the connector are inserted into the two conductive plates to connect the two conductive plates so as to form concave portions, and slots are formed in the concave portions.

11. The tag antenna structure of claim 1, wherein the tag antenna has a distance of ¼ or less of a wavelength of transmitted and received electromagnetic waves from the conductive ground layer and is adhered to the AMC layer.

12. The tag antenna structure of claim 1, wherein a second dielectric layer is formed on the AMC layer, wherein the tag antenna is mounted on the second dielectric layer.

13. The tag antenna structure of claim 1, wherein a surface of the AMC layer has a HIS (High Impedance Surface) characteristic.

14. The tag antenna structure of claim 1, wherein the substrate is formed of epoxy.

15. A wireless identification system, comprising a tag antenna structure, the tag antenna structure including;

a substrate formed of a first dielectric;

a conductive ground layer formed underneath the substrate;

an artificial magnetic conductor (AMC) layer formed on the substrate; and a tag antenna including a wireless identification chip adhered to the AMC layer, wherein the tag antenna structure is free of vias between the AMC layer and the conductive ground layer.

16. The wireless identification system of claim 15, wherein the tag antenna structure has a low-profile structure and is directly mounted on a conductor.

17. The wireless identification system of claim 16, wherein the AMC layer comprises unit cells which have square patch shapes and are arrayed at the predetermined distances.

18. The wireless identification system of claim 16, wherein the wireless identification chip operates by energy of received electromagnetic waves, and the tag antenna comprises the conductive plates which have square patch shapes and are connected to each other through the connector, wherein the wireless identification chip is disposed in the connector.

19. The wireless identification system of claim 16, wherein the wireless identification system is an RFID (radio frequency identification) system.

20. A tag antenna structure for wireless identification, comprising:

a substrate formed of a first dielectric;

a conductive ground layer formed underneath the substrate;

an artificial magnetic conductor (AMC) layer formed on the substrate; and a tag antenna including:

a wireless identification chip adhered to the AMC layer, two conductive plates connected to each other through a connector, the wireless identification chip being disposed in the connector.

* * * * *